United States Patent
Hwang

(10) Patent No.: US 9,142,718 B2
(45) Date of Patent: Sep. 22, 2015

(54) LIGHT EMITTING DEVICE

(75) Inventor: Sung Min Hwang, Anyang-Si (KR)

(73) Assignee: LG Innotek Co., Ltd., Seoul (KR)

(*) Notice: Subject to any disclaimer, the term of this patent is extended or adjusted under 35 U.S.C. 154(b) by 890 days.

(21) Appl. No.: 12/634,526

(22) Filed: Dec. 9, 2009

(65) Prior Publication Data

US 2010/0213481 A1 Aug. 26, 2010

(30) Foreign Application Priority Data

Feb. 25, 2009 (KR) .................. 10-2009-0016021

(51) Int. Cl.
*H01L 33/00* (2010.01)
*H01L 33/14* (2010.01)
*H01L 33/22* (2010.01)
*H01L 33/38* (2010.01)

(52) U.S. Cl.
CPC .............. *H01L 33/145* (2013.01); *H01L 33/22* (2013.01); *H01L 33/382* (2013.01)

(58) Field of Classification Search
CPC .................................................. H01L 33/145
USPC .................................................... 257/98, 99
See application file for complete search history.

(56) References Cited

U.S. PATENT DOCUMENTS

| | | | |
|---|---|---|---|
| 4,862,471 A | 8/1989 | Pankove | |
| 5,753,940 A | 5/1998 | Komoto | |
| 5,905,275 A | 5/1999 | Nunoue et al. | |
| 6,429,460 B1* | 8/2002 | Chen et al. | 257/79 |
| 6,455,343 B1 | 9/2002 | Chen et al. | |
| 6,969,874 B1* | 11/2005 | Gee et al. | 257/98 |
| 7,714,345 B2* | 5/2010 | Negley | 257/99 |
| 2002/0117681 A1* | 8/2002 | Weeks et al. | 257/106 |
| 2002/0134987 A1* | 9/2002 | Takaoka | 257/98 |
| 2003/0222269 A1* | 12/2003 | Lin et al. | 257/99 |
| 2005/0285126 A1 | 12/2005 | Wu et al. | |
| 2006/0043409 A1 | 3/2006 | Ohmi | |
| 2006/0145164 A1* | 7/2006 | Illek et al. | 257/79 |
| 2007/0200134 A1* | 8/2007 | Therrien et al. | 257/103 |
| 2007/0262330 A1* | 11/2007 | Lee et al. | 257/79 |
| 2008/0230791 A1* | 9/2008 | Lin et al. | 257/91 |

FOREIGN PATENT DOCUMENTS

| | | |
|---|---|---|
| JP | 7-79018 A | 3/1995 |
| JP | 2004-311677 A | 11/2004 |
| JP | 2008-041839 A | 2/2008 |
| KR | 10-2005-0070854 A | 7/2005 |
| KR | 10-2006-0110521 A | 10/2006 |
| KR | 10-2008-0020206 A | 3/2008 |

OTHER PUBLICATIONS

C Ronning, E.P. Carlson, R.F Davis, Ion implantation into gallium nitride, Physics Reports, vol. 351, Issue 5, Sep. 2001, pp. 349-385, ISSN 0370-1573, 10.1016/S0370-1573(00)00142-3.*

* cited by examiner

*Primary Examiner* — Mark Tornow
(74) *Attorney, Agent, or Firm* — Birch, Stewart, Kolasch & Birch, LLP

(57) ABSTRACT

A light emitting device including a light emitting structure having a first conductive semiconductor layer, an active layer disposed under the active layer and a second conductive semiconductor layer disposed under the active layer; a trench formed in a portion of the light emitting structure; a current barrier layer in the trench and configured to hinder current supply to the active layer at a portion where the trench is located and to block the active layer over the trench from emitting light; and a first electrode on the first conductive semiconductor layer above the portion where the trench is located.

22 Claims, 6 Drawing Sheets

LIGHT EMITTING DEVICE

CROSS-REFERENCE TO A RELATED APPLICATIONS

The present application claims the benefit under 35 U.S.C. §119 of Korean Patent Application No. 10-2009-0016021, filed on Feb. 25, 2009, which is hereby incorporated by reference in its entirety.

BACKGROUND OF THE INVENTION

1. Field of the Invention

The present disclosure relates to a light emitting device.

2. Discussion of the Background

Light Emitting Devices include P-N junction diodes that convert electrical energy into light energy. The diodes are formed by combining group III and V elements on the periodic table. Light Emitting Devices can also emit various colors by controlling the composition ratio of compound semiconductors.

In more detail, when a forward voltage is applied, an electron of an n-layer is combined with a hole of a p-layer to emit energy corresponding to an energy gap between the conduction band and the valance band. The energy is then emitted as light.

In addition, nitride semiconductors, for example, are being considered for the fields of optical devices and high-power electronic devices, because of their high thermal stability and wide band gap energy. In particular, blue LEDs, green LEDs and UV LEDs that use nitride semiconductors are available. Further, the light emitting devices may be categorized into a horizontal type and a vertical type.

Also, an N-type electrode and a P-type electrode are disposed over/under related-art vertical light emitting devices, respectively. In this instance, electrons and holes injected by the N-type electrode and the P-type electrode, respectively, are entered into an active layer, and are combined with each other to generate light. The generated light is then emitted to the outside or is reflected by the N-type electrode and lost.

Thus, related-art light emitting devices have a limitation in that the light emitting efficiency is reduced, because light emitted under the N-type electrode is reflected by the N-type electrode. Also, related-art light emitting devices have a limitation in that excessive heat is generated due to the re-absorption of the light reflected by the N-type electrode. Moreover, related-art light emitting devices have a limitation in a deterioration of life span and reliability because of current crowding.

SUMMARY OF THE INVENTION

Accordingly, one object of the present invention is to address the above-noted and other problems.

Another object of the present invention is to provide a light emitting device capable of enhancing light extraction efficiency as well as a current spreading efficiency.

To achieve these and other advantages and in accordance with the purpose of the present invention, as embodied and broadly described herein, the present invention provides in one aspect a light emitting device including a light emitting structure having a first conductive semiconductor layer, an active layer disposed under the active layer, and a second conductive semiconductor layer disposed under the active layer; a trench in a portion of the light emitting structure; a current barrier layer in the trench and configured to hinder current supply to the active layer at a portion where the trench is located and to block the active layer over the trench from emitting light; and a first electrode on the first conductive semiconductor layer above the portion where the trench is located.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by illustration only, and thus are not limitative of the present invention, and wherein.

DETAILED DESCRIPTION OF THE EMBODIMENTS

Reference will now be made in detail to the embodiments of the present disclosure, examples of which are illustrated in the accompanying drawings.

Figure 1:
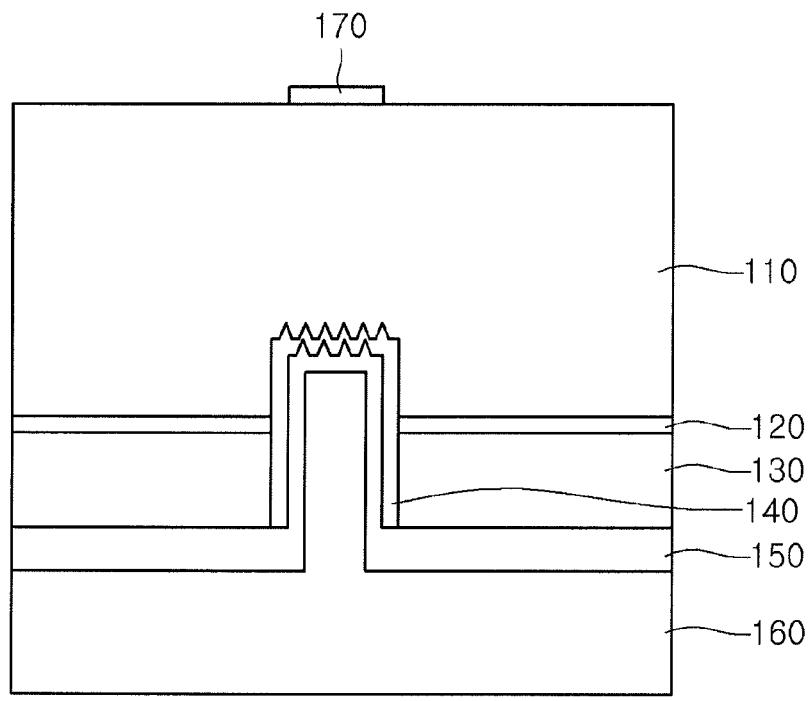
FIG. 1 is a cross-sectional view illustrating a light emitting device according to an embodiment of the present invention.

FIG. 1 is a cross-sectional view illustrating a light emitting device according to an embodiment of the present invention. As shown, the light emitting device includes a first conductive semiconductor layer 110, an active layer 120, a second conductive semiconductor layer 130, a current barrier layer 140, a reflective layer 150, a substrate 160 and a first electrode 170.

In addition, the current barrier layer 140 is formed in a trench T that is made by removing a portion of the light emitting structure. A second electrode may also be disposed on the second conductive semiconductor layer 130. Further, the current barrier layer 140 may include at least one of a dielectric layer, a diffusion layer and an ion implantation layer.

The light emitting device according to an embodiment of the present invention increases light extraction efficiency by efficiently controlling the current flow, and enhances the reliability of the device using current spreading. In particular, the light emitting device according to an embodiment of the present invention increases a light extraction efficiency by forming a current barrier layer, a trench and a roughness area at a position corresponding to the first electrode, and thus increases the light output power.

Hereinafter, a method of manufacturing a light emitting device according to an embodiment of the present invention will be described with reference to FIGS. 2 to 8.

The light emitting device may be formed of a material such as GaN, GaAs, GaAsp and GaP. For example, a green-blue LED may be formed of GaN (InGaN) and yellow to red LEDs may be formed of InGaAlP and AlGaAs. Full colors may then be implemented according to the material composition.

Figure 2:
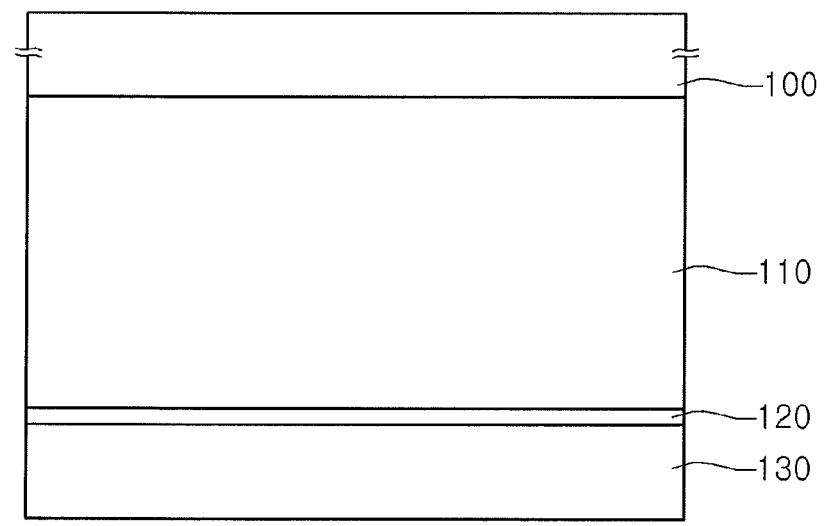
FIGS. 2 to 8 are cross-sectional views illustrating a method of manufacturing a light emitting device according to an embodiment of the present invention.

First, as shown in FIG. 2, a first substrate 100 is prepared. The first substrate 100 may be, for example, a sapphire ($Al_2O_3$) substrate and a SiC substrate. A wet-washing process may also be performed on the first substrate 100 to remove impurities on the surface thereof.

Then, the first conductive semiconductor layer 110 is formed on the first substrate 100. For example, the first conductive semiconductor layer 110 may be formed by forming an N-type GaN layer through a Chemical Vapor Deposition (CVD) process, a Molecular Beam Epitaxy (MBE) process, a sputtering process or a Hydride Vapor Phase Epitaxy (HVPE) process. The first conductive semiconductor layer 110 may also be formed by implanting a trimethyl gallium gas (TMGa), an ammonium gas ($NH_3$), a nitrogen gas ($N_2$) and a silane gas ($SiH_4$) including an N-type impurity such as silicon (Si) into a chamber.

In one embodiment, an undoped semiconductor layer may be formed on the first substrate 100, and then the first conductive semiconductor layer 110 may be formed on the undoped semiconductor layer. For example, an undoped GaN layer may be formed on the first substrate 100, and then an N-type GaN layer 110 may be formed on the undoped GaN layer.

Then, the active layer 120 is formed on the first conductive semiconductor layer 110. The active layer 120 is a layer emitting light and has energy determined by an intrinsic energy band of an active layer (light emitting layer) material when electrons injected from the first conductive semiconductor layer 110 meet holes injected from the second conductive semiconductor layer 130. The active layer 120 may also have a quantum well structure that is formed by alternate or successive lamination of nitride semiconductor thin layers having different energy bands. For example, the active layer 120 may have a multi-quantum well structure of InGaN/GaN formed by implanting a trimethyl gallium gas (TMGa), an ammonium gas ($NH_3$), a nitrogen gas ($N_2$) and a Trimethyl indium gas (TMIn), etc.

The second conductive semiconductor layer 130 is then formed on the active layer 120. For example, the second conductive semiconductor layer 130 may include a P-type GaN layer formed by implanting a trimethyl gallium gas (TMGa), an ammonium gas ($NH_3$), a nitrogen gas ($N_2$) and bis-ethylcyclopentadienyl magnesium ($EtCp_2Mg$) {Mg $(C_2H_5C_5H_4)_2$} including a P-type impurity such as magnesium (Mg) into a chamber.

Figure 3:
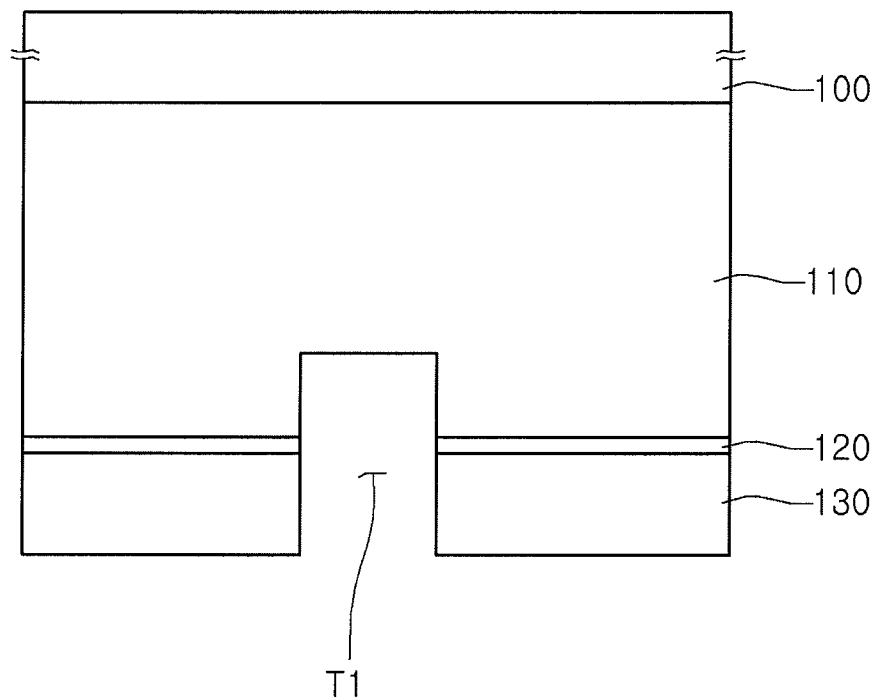

As shown in FIG. 3, a first trench T1 is formed by removing a portion of the second conductive semiconductor layer 130, the active layer 120 and the first conductive semiconductor layer 110. For example, an etching process may be performed on a spatially opposite position to the first electrode 170 until a portion of the first conductive semiconductor layer 110 is exposed. The etching process for forming the first trench T1 may also be performed through a dry or wet etching process.

Further, the first trench T1 is formed at a position that spatially overlaps the first electrode 170. The first trench T1 may also be formed by etching the second conductive semiconductor layer 130, the active layer 120 and the first conductive semiconductor layer 110 to expose a portion of the first conductive semiconductor layer 110.

In a light emitting device according to the embodiment of the present invention, light is not generated at a region where the first trench T1 is formed because a portion of the active layer 120 is removed. Accordingly, light absorption by the first electrode 170 that is located over the first trench T1 can be minimized. Also, the current concentration under the first electrode 170 can be prevented and instead causes current spreading, thereby improving the reliability of the light emitting device.

Figure 4:
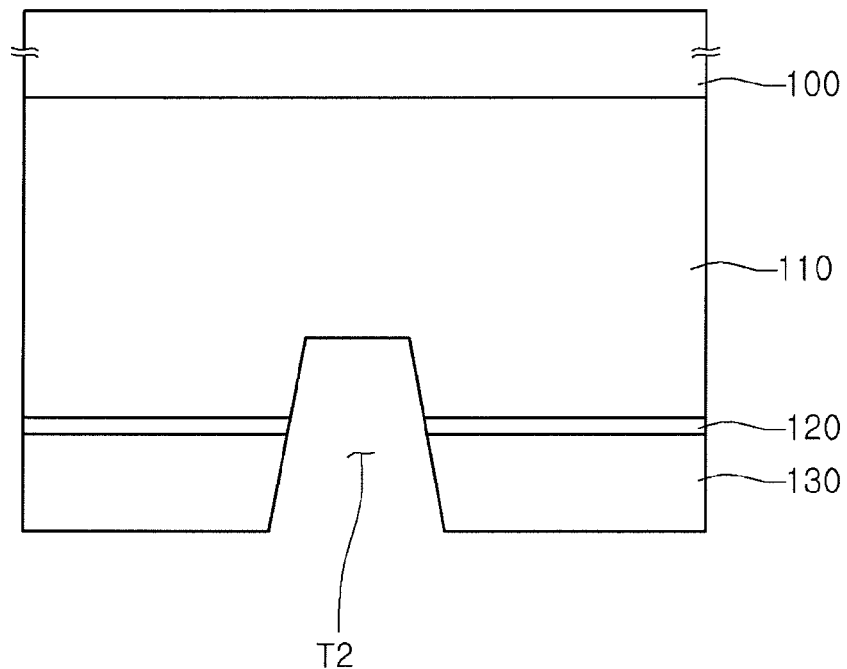
Figure 5:
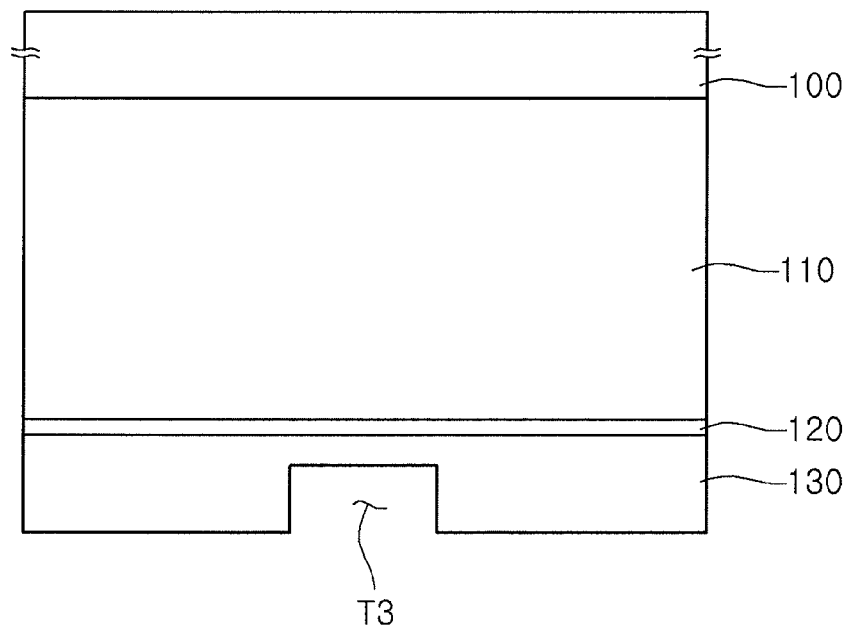

FIGS. 4 and 5 illustrate different shapes for the trench. For example, as illustrated in FIG. 4, a second trench T2 having a certain inclination is formed through an etching process on the light emitting device. Further, the width of the top of the second trench T2 is smaller than the width of the bottom of the second trench T2 due to an etching process considering the crystal orientation of the light emitting device. Accordingly, light emitted by a subsequently formed light emitting layer may be efficiently reflected to the outside.

As illustrated in FIG. 5, a third trench T3 is formed through an etching process on the light emitting device. For example, only a portion of the second conductive semiconductor layer 130 may be etched, and then the current barrier layer 140 is formed on the third trench T3. Also, because the current barrier layer 140 hinders smooth current supply to a region where the third trench T3 is formed, the active layer 120 over the trench T3 does not emit light. Accordingly, the light absorption by the first electrode 170 over the third trench T3 can be minimized.

Figure 6:
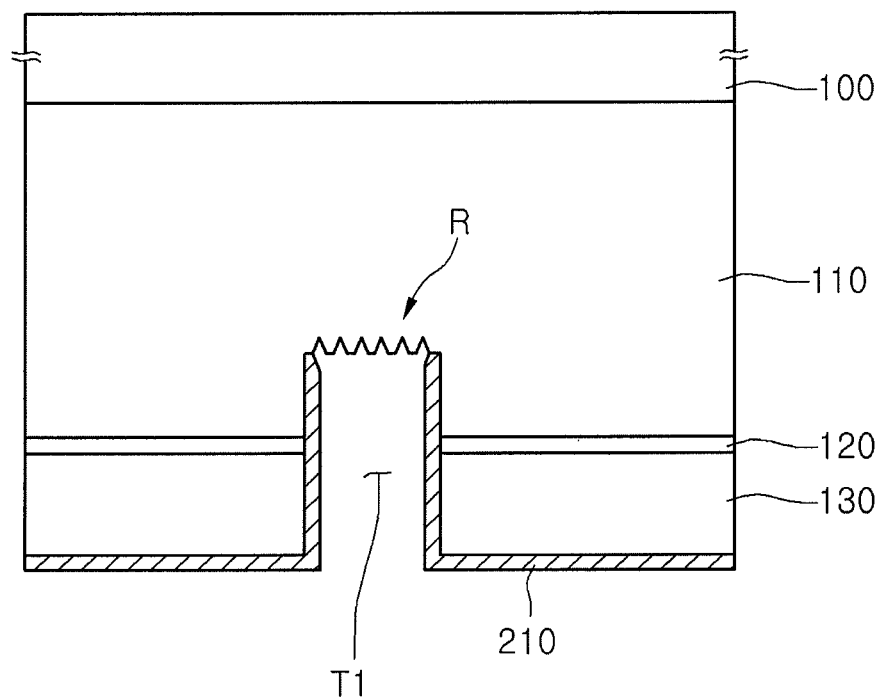

Hereinafter, the first trench T1 as described in FIG. 3 will be described as an example, but as shown in FIGS. 5 and 6, the trench can have various shapes. As illustrated FIG. 6, a roughness R is formed on the first conductive semiconductor layer 110 exposed by the first trench T1. For example, a first mask pattern 210 is formed to expose the first conductive semiconductor layer 110 at the bottom of the first trench T1. The roughness R may also be formed by a wet etching solution such as KOH and NaOH. The first mask pattern 210 may also be formed of a photo-sensitive layer or an insulating layer such as a nitride or an oxide.

Also, the first mask pattern 210 may have a mesh pattern selectively exposing a region where the roughness R is formed. For example, when the first mask pattern 210 has the mesh pattern, the roughness R may be formed through a dry etching process. When a region where the roughness R that is formed is exposed, the roughness R may be formed through a wet etching process.

Figure 7:
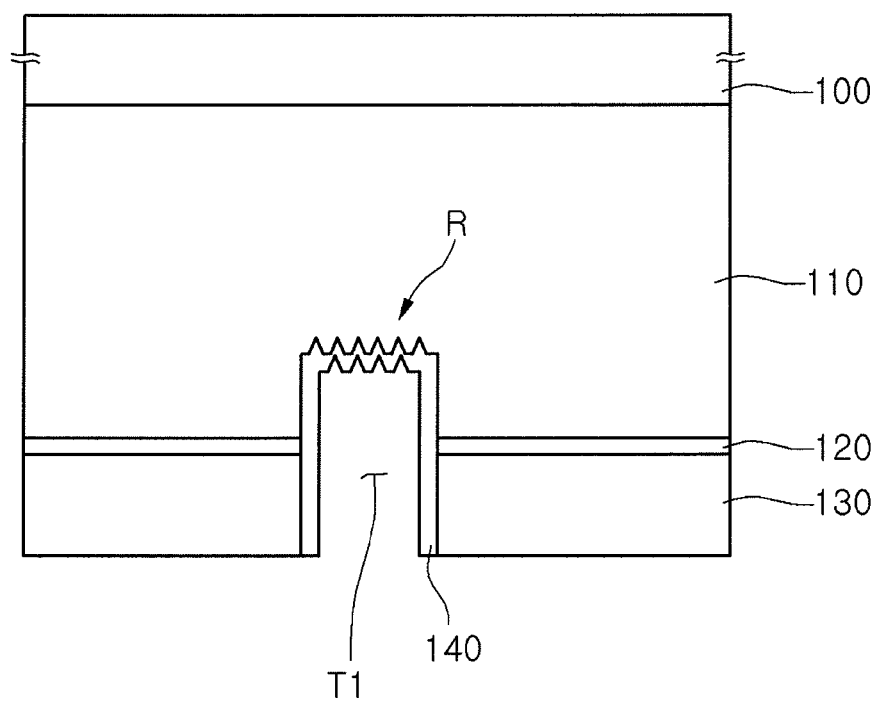

The roughness R may also have a periodic pattern, or a non-periodic pattern. In addition, the light extraction efficiency and light output power is increased by the roughness R. As illustrated in FIG. 7, after the first mask pattern 210 is removed, the current barrier layer 140 is formed in the first trench T1. In addition, the current barrier layer 140 may include at least one of a dielectric layer and an amorphous layer.

For example, the current barrier layer 140 may be formed of a nitride such as SiN or an oxide such as $SiO_2$ through a vapor deposition process. An amorphous layer having high electrical resistance may also be formed by implanting protons having high kinetic energy into the first trench T1 to break the single crystal state of the interface of the first trench T1.

In one embodiment of the present invention, the current barrier layer 140 may be formed on a portion of the second conductive semiconductor layer 130, as well as on the side surface and the bottom of the first trench T1. Accordingly, the current barrier layer 140 may be firmly maintained. Also, when the third trench T3 as illustrated in FIG. 5 is formed by etching a portion of the second conductive semiconductor layer 130, the current barrier layer 140 may include at least one of a dielectric layer, an amorphous layer, a diffusion layer, and an ion implantation layer.

Further, the current barrier layer 140 cuts off current supply by a dielectric layer using an oxide and a nitride or an amorphous layer using protons. Alternatively, the current supply may be cut off current by forming a first conductive diffusion layer or a first conductive ion implantation layer to block implantation of electrons or holes. For example, when the second conductive semiconductor layer 130 is formed of P-type GaN, the current supply may be cut off by diffusing or implanting N-type ions to form an N-type diffusion layer or an N-type ion implantation layer.

Figure 8:
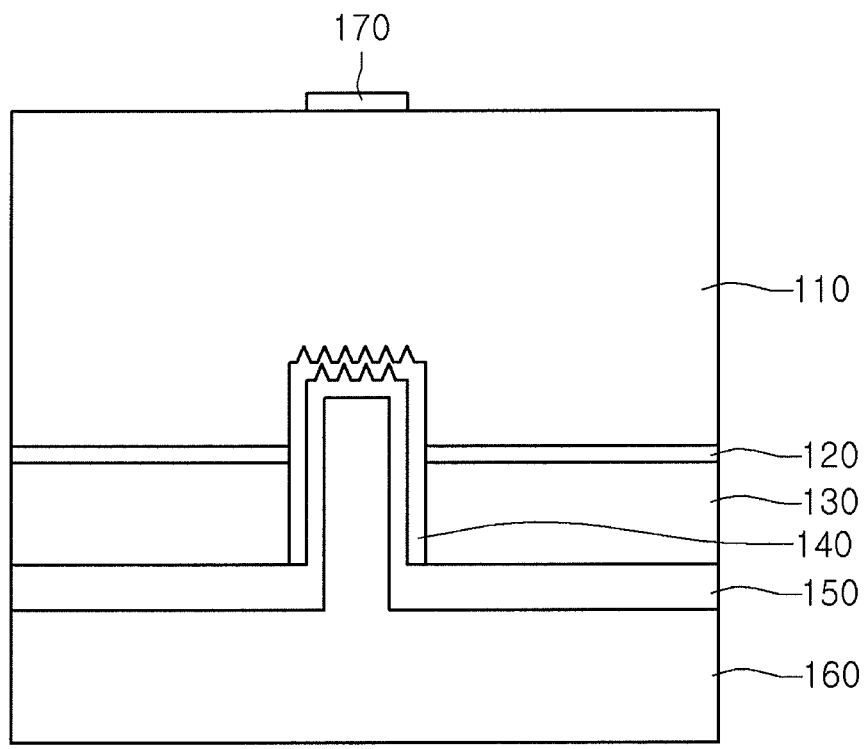

Also in FIG. 8, a second electrode (not shown) is formed on the second conductive semiconductor layer 130 and the current barrier layer 140. The second electrode may include an ohmic layer, the reflecting layer 150, an adhesive layer and the second substrate 160. The second electrode may also be formed of at least one of a semiconductor substrate implanted with Ti, Cr, Ni, Al, Pt, Au, W, and impurities.

For example, the second electrode may include an ohmic layer, and may be formed by multi-stacking a single metal, a metal alloy and a metal oxide. For example, the ohmic layer may include at least one of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO, but is not limited to these materials.

The second electrode may also include the reflection layer 150 or an adhesive layer. Further, when the second electrode includes the reflection layer 150, the reflection layer 150 may be formed of a metal layer including Al, Ag or an alloy including Al or Ag. Al or Ag also effectively reflects light generated from an active layer to enhance light extraction efficiency of the light emitting device.

When the second electrode includes an adhesive layer, the reflection layer 150 also serves as the adhesive layer, or an adhesive layer may be formed using Ni and Au. In addition, FIG. 8 shows that the reflection 150 fills only a portion of the first trench T1. However, the embodiments of the present invention are not limited to this structure. For example, the reflection 150 may fill the entirety of the first trench T.

In addition, the second substrate 160 is formed on the reflection layer 150. The second substrate 160 may include a highly electrical conductive metal, a metal alloy or a conductive semiconductor material to efficiently implanting holes. For example, the second substrate 160 may be formed of at least one of Cu, a Cu alloy, Si, Mo and SiGe. The second substrate 160 may also be formed through an electro-chemical metal vapor deposition method or a bonding method using a eutectic metal.

Then, the first substrate 100 is removed. For example, the first substrate 100 may be removed using a high-power laser lift-off or a chemical etching method. Also, the first substrate 100 may be removed through a physical polishing process. The first electrode 170 is then formed on the first conductive semiconductor layer 110 exposed by the removal of the first substrate 100. The first electrode 170 may also be formed on the first conductive semiconductor layer 110 to spatially overlap a portion of the first trench T1.

In one embodiment, because the active layer 120 does not exist in the first trench T1 vertically under the first electrode 170, the light generation by combination of carriers (electrons and holes) does not occur. Also, the trench, which is an etched region, may be covered with the current barrier layer 140, and thus a current does not flow in the trench and is diffused to other regions. That is, the trench region is covered with the current barrier layer 140 to perform a role of a current blocking layer. Therefore, efficient current flow contributes to a reliability of the light emitting device. Also, the light absorption by the first electrode 170 can be minimized to increase the quantity of light.

Further, the roughness formed after an etching of the first conductive semiconductor layer 110 improves the light extraction efficiency by light scattering. Also, the current spreading efficiency as well as light extraction efficiency is simultaneously enhanced.

In addition, the trench may have various shapes such as a well-shaped trench, oval-shaped, prism-shaped, cylinder shape, square shape, rectangular shape circular shape and any other shape.

In addition, in the description of embodiments, when a layer (or film) is referred to as being 'on/over' another layer or substrate, it can be directly on/over another layer or substrate, or intervening layers may also be present. Further, when a layer is referred to as being 'under/below' another layer, it can be directly under/below another layer, and one or more intervening layers may also be present. In addition, when a layer is referred to as being 'between' two layers, it can be the only layer between the two layers, or one or more intervening layers may also be present.

Also, a reference in this specification to "one embodiment," "an embodiment," "example embodiment," etc., means that a particular feature, structure or characteristic described in connection with the embodiment is included in at least one embodiment of the invention. The appearances of such phrases in various places in the specification are not necessarily all referring to the same embodiment. Further, when a particular feature, structure or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a light emitting structure including a first conductive semiconductor layer, an active layer disposed under the first conductive semiconductor layer, and a second conductive semiconductor layer disposed under the active layer;
a trench in the light emitting structure;
a current barrier layer in the trench;
a first electrode on an upper side of the light emitting structure; and
a second electrode on a bottom side of the light emitting structure,
wherein the second electrode comprises a protruding portion extending into the light emitting structure and the protruding portion is in the trench,
wherein a substantially central portion of the protruding portion spatially overlaps with a substantially central portion of the first electrode,
wherein a length of the first electrode is shorter than that of a top surface of the protruding portion in a cross section, and
wherein the second electrode further comprises:
a substrate; and
a reflection layer disposed between the current barrier layer and the substrate, the reflection layer being formed in a structure partially filling the trench, and a portion of the substrate being formed in a structure filling a remainder of the trench.

2. The light emitting device according to claim 1, wherein the trench is formed in a portion of the second conductive semiconductor layer.

3. The light emitting device according to claim 1, wherein the trench is formed in a portion of the second conductive semiconductor layer and the active layer.

4. The light emitting device according to claim 1, wherein the trench is formed in a portion of the second conductive semiconductor layer, the active layer and the first conductive semiconductor layer.

5. The light emitting device according to claim 1, wherein the trench exposes a portion of the first conductive semiconductor layer and the protruding portion of the second electrode penetrates into the second conductive semiconductor layer and the active layer, and extends into a portion of the first conductive semiconductor layer.

6. The light emitting device according to claim 1, wherein the light emitting structure comprises a first roughness on a portion of the light emitting structure exposed by the trench, and a second roughness on a top surface of the reflection layer.

7. The light emitting device according to claim 6, wherein the current barrier layer is on the first roughness and a side surface of the trench and the protruding portion of the second electrode comprises a second roughness on a top surface of the protruding portion.

8. The light emitting device according to claim 1, wherein the current barrier layer comprises an amorphous layer.

9. The light emitting device according to claim 1, wherein the current barrier layer includes a diffusion layer.

10. The light emitting device according to claim 9, wherein the diffusion layer is conducted in a first conductive type.

11. The light emitting device according to claim 1, wherein the first electrode and the current barrier layer partially overlap each other spatially and vertically.

12. The light emitting device according to claim 1, wherein the active layer is removed at a region where the first electrode and the current barrier layer partially overlap each other spatially and vertically such that light is not emitted at the region.

13. The light emitting device according to claim 1, wherein side surfaces of the trench are tilted at a predetermined angle.

14. The light emitting device according to claim 13, wherein a width of a lower side of the trench is greater than a width of an upper side of the trench.

15. The light emitting device according to claim 1, wherein the second electrode further comprises at least one of an ohmic layer and an adhesive layer.

16. The light emitting device according to claim 15, wherein the ohmic layer comprises at least one of a single metal, a metal alloy and a metal oxide.

17. The light emitting device according to claim 15, wherein the reflection layer comprises at least one of Al, Ag and an alloy including Al or Ag, and
wherein the reflection layer directly contacts the second conductive semiconductor layer.

18. The light emitting device according to claim 15, wherein the substrate comprises at least one of Cu, a Cu alloy, Si, Mo and SiGe.

19. The light emitting device according to claim 1, wherein the current barrier layer contacts the active layer.

20. The light emitting device according to claim 1, wherein a lateral width of the current barrier layer is smaller than a lateral width of the second electrode.

21. The light emitting device according to claim 1, wherein the first electrode overlaps with a top surface of the current barrier layer.

22. The light emitting device according to claim 1, wherein the first electrode overlaps with a top surface of the reflection layer.

* * * * *